United States Patent [19]
Hurwitt

[11] Patent Number: 5,783,048
[45] Date of Patent: *Jul. 21, 1998

[54] SPUTTERING CATHODE WITH UNIFORMITY COMPENSATION

[75] Inventor: Steven Hurwitt, Park Ridge, N.J.

[73] Assignee: Tokyo Electron Limited, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 734,207

[22] Filed: Oct. 21, 1996

Related U.S. Application Data

[63] Continuation of Ser. No. 393,614, Feb. 23, 1995, abandoned.
[51] Int. Cl.$^6$ ............................................. C23C 14/34
[52] U.S. Cl. .................... 204/192.12; 204/298.19; 204/298.2
[58] Field of Search .................. 204/192.12, 298.17, 204/298.18, 298.19, 298.2, 298.37

[56] References Cited

U.S. PATENT DOCUMENTS

| | | | |
|---|---|---|---|
| 3,956,093 | 5/1976 | McLeod | 204/298.2 X |
| 4,891,560 | 1/1990 | Okumura et al. | 204/298.19 X |
| 4,971,674 | 11/1990 | Hata | 204/298.2 X |
| 5,047,130 | 9/1991 | Akao et al. | 204/298.2 X |
| 5,130,005 | 7/1992 | Hurwitt et al. | 204/298.2 X |
| 5,160,595 | 11/1992 | Hauzer et al. | 204/298.2 X |
| 5,171,415 | 12/1992 | Miller et al. | 204/298.2 X |
| 5,182,001 | 1/1993 | Fritsche et al. | 204/298.2 X |
| 5,196,105 | 3/1993 | Feuerstein et al. | 204/298.19 |
| 5,277,778 | 1/1994 | Daube et al. | 204/298.19 |
| 5,417,833 | 5/1995 | Harra et al. | 204/298.2 |

FOREIGN PATENT DOCUMENTS

| | | | |
|---|---|---|---|
| 61-246368 | 11/1986 | Japan | 204/298.2 |
| 62-167877 | 7/1987 | Japan | 204/298.2 |

*Primary Examiner*—Nam Nguyen
*Attorney, Agent, or Firm*—Wood, Herron & Evans, L.L.P.

[57] ABSTRACT

A sputtering apparatus for forming a thin film on a substrate is disclosed. The sputtering apparatus includes a target for providing target material for forming the thin film, wherein the target includes a first area. The sputtering apparatus further includes a plasma discharge to enable removal of target material from the target. In addition, a main magnet is provided for generating a main magnetic field for controlling the plasma discharge to remove the target material. Further, a compensating magnet is utilized which is positioned adjacent to the first area. The compensating magnet generates a compensating magnetic field which interacts with the main magnetic field to control the plasma discharge in the first area to form a desired erosion pattern in the first area and enable formation of a substantially uniform film thickness on the substrate.

12 Claims, 8 Drawing Sheets

SPUTTERING CATHODE WITH UNIFORMITY COMPENSATION

This is a continuation of application(s) Ser. No. 08/393,614 filed on Feb. 23, 1995, abandoned which is hereby incorporated by reference.

FIELD OF THE INVENTION

This invention relates to apparatus for the deposition of thin films by sputtering, and in particular, to a sputtering cathode having a compensating magnet device which reduces non-uniformities in a thickness of deposited film.

BACKGROUND OF THE INVENTION

In a conventional sputter deposition system, a sputtering target is utilized to form a thin coating or film of a desired material on a substrate as part of a sputtering process. Referring to FIG. 1, a cross sectional view for a conventional arrangement for a target 10 and substrate 12 is shown. The target 10 and substrate 12 are located within a processing chamber (not shown) wherein the sputtering process is performed. In this regard, it is noted that a sputter deposition system may include a plurality of processing chambers each including a target and substrate arrangement as shown in FIG. 1.

The target 10 includes a top surface 14 and a concave shaped bottom, or sputtering, surface 16. The sputtering surface 16 provides target material for forming a thin film 18 on the substrate 12 during the sputtering process. The top surface 14 is secured to a sputtering cathode 20 which serves to cool the target 10 during the sputtering process. The substrate 12 is removeably secured to a support fixture 26 adjacent an outer edge 15 of the substrate 12. In addition, the substrate 12 is positioned a predetermined distance from the sputtering surface 16, thus forming a gap 28 between the substrate 12 and the sputtering surface 16.

In use, a process gas (not shown), such as argon, is introduced into the gap 28 and the processing chamber is maintained at a vacuum level suitable for sputtering. A high DC or AC voltage is then applied to the cathode 20 and target 10 to cause the formation of a plasma discharge having positively charged argon ions which bombard the sputtering surface 16. This causes target material to be removed from the sputtering surface 16, thus initiating a deposition process wherein some of the target material is deposited onto the substrate 12 to form the film 18. Typically, the deposition process may require between 5 seconds and 5 minutes to complete. In many systems, the substrate 12 is held in a stationary position relative to the sputtering surface 16 during the deposition process. Alternatively, in other systems, the substrate 12 may be slowly scanned in a direction parallel to the sputtering surface 16.

The cathode 20 may include a main magnet 30 for controlling the shape and relative intensity of the plasma discharge over various locations on the sputtering surface 16. In addition, the main magnet 30 may be adapted to rotate relative to the target 10 about a rotation axis 32. Referring to FIG. 2A in conjunction with FIG. 1, a view of the sputtering surface 16 along line 2A—2A of FIG. 1 is shown. The sputtering surface 16 has a substantially circular shape which is defined by a peripheral wall 24. The main magnet 30 is typically configured to create a continuous closed magnetic tunnel 34 (shown as dashed lines) having a predetermined shape. By way of example, the magnetic tunnel 34 may include a plurality of lobe portions 38 each having an outer peripheral lobe section 39 located adjacent to the peripheral wall 24 of the target 10. Rotation of the main magnet 30 about the axis 32 causes a corresponding rotation of the magnetic tunnel 34 relative to the sputtering surface 16. This controls the plasma discharge so as to cause removal of target material in a symmetric pattern from the sputtering surface 16 to form concentric grooves in a well known manner.

By way of example, primary 36, second 40 and third 42 concentric grooves each having respective diameters may be symmetrically formed about a center area 22 of the sputtering surface 16. The primary groove 36 has the largest diameter and is positioned adjacent to the peripheral wall 24. The third groove 42 has the smallest diameter and is positioned around the center area 22. The second groove 40 has a diameter whose size is between that of the primary 36 and third 42 grooves, thus positioning the second groove 40 between the primary 36 and third 42 grooves.

Referring to FIG. 2B, a cross-sectional side view of an erosion profile 44 of the target 10 along section line 2B—2B of FIG. 2A is shown. As the magnetic tunnel 34 rotates, the plasma discharge causes the formation of a symmetric erosion pattern wherein separate portions of the sputtering surface 16 erode in a circular pattern to form the primary 36, second 40 and third 42 grooves. Typically, the primary groove 36 is formed deeper, and has a greater circumference, than either the second 40 and third 42 grooves. This indicates that a greater amount of target material is eroded to form the primary groove 36 than is eroded to form either the second 40 or third 42 grooves. Therefore, formation of the primary groove 36 provides a substantial portion of the material used to form the film 18, which thus has a substantial effect on overall film uniformity on the substrate 12. Further, the erosion of a substantial amount of material near the peripheral wall 24 also improves the capability of providing a uniform film thickness in areas near the outer edge 15 of the substrate 12.

Referring to FIG. 2C, a left portion of the target 10 and cathode 20 described in conjunction with FIG. 1 is shown in an enlarged view. In FIG. 2C, a configuration is depicted for the primary groove 36 (shown as dashed lines). The main magnet 30 generates a main magnetic field 56 (shown as dashed lines) oriented in a counterclockwise direction. The magnetic field 56 serves to control the shape and intensity of the plasma discharge in order to ultimately form the primary groove 36. The primary groove 36 includes a pair of walls each of which extend gradually deeper into the target 10 and meet to thus define the deepest portion of the primary groove 36 at a groove center 60. Further, the groove center 60 is positioned a first distance A from the peripheral wall 24 and within a predetermined area of the sputtering surface 16.

It is desirable that the film 18 formed on the substrate 12 have a highly uniform thickness which is approximately equal to or less than ±5% and preferably as small as ±1% relative to the thickest and thinnest areas of the film 18. Several factors affect the ability to produce a film having a highly uniform thickness. One group of factors includes parameters such as the geometrical relationship between the target 10 and substrate 12, the design of the cathode 20 and the erosion pattern of material removed from the sputtering surface 16 resulting from the shape of the magnetic tunnel 34. Referring to FIG. 2D, a plot of a deposition profile 46 for a simulated film layer is shown. The deposition profile 46 illustrates thickness uniformity for the layer along a radius extending in any selected direction on a substrate. The layer was formed through use of a computer modelling technique which simulated a sputtering process for forming the layer in accordance with selected input parameters. One input parameter included eroding a sputtering surface so as to form the erosion profile 44 previously described in conjunction with FIG. 2B. Another input parameter included positioning the sputtering surface 2 inches from a substrate having a 4 inch radius. These parameters result in a simulated, or theoretical, thickness uniformity of 0.942% for the simulated layer.

Preferably, rotation of the main magnet 30 causes the formation of a symmetrical film on a substrate. The deposition profile 46 would then represent overall thickness uniformity along any radius extending in any direction on a substrate. Further, any undesirable non-uniformities existing in a symmetrical film would also be symmetrical. Such symmetrical non-uniformities could then be reduced by techniques such as changing the distance between the sputtering surface 16 and the substrate 12 or by modifying the erosion profile 44 through adjustment of the shape of the magnetic tunnel 34.

However, it has been found that a second group of factors exist which frequently cause the formation of non-uniformities which are asymmetrical. In particular, these factors relate to asymmetrical system related conditions such as the presence of nearby structures which may distort the shape of the plasma discharge. Another factor is that the plasma discharge may be undesirably affected by other cathodes located in nearby processing chambers.

An additional factor is that the distribution of the process gas relative to the target 10 and substrate 12 may be undesirably affected by the existence of flow and pressure gradients. An example of the effect of such flow and pressure gradients will now be described in conjunction with FIG. 3. FIG. 3 depicts a map 55, plotted relative to x-y axes, of the uniformity of an aluminum film (not shown) formed on a 200 mm diameter silicon wafer (not shown). The aluminum film was formed by using the conventional arrangement for the target 10 and substrate 12 described previously in conjunction with FIGS. 1–2C. In FIG. 3, a plurality of first contour lines 48 are shown, each of which are obtained by connecting points measured on the wafer which have the same film thickness. The first contour lines 48 include a mean contour line 50 (shown darker than other contour lines) indicating a mean film thickness. Additionally, first contour lines designated by either a "+" sign or a "−" sign indicate film thicknesses which are either less than or greater than the mean film thickness, respectively. Thickness values for selected contour lines are shown in descending order in TABLE I.

TABLE I (microns)

1.22124
1.20930
1.19753
1.18567 (MEAN)
1.17381
1.16196
1.15010

Further, film non-uniformity was determined to be 3.84%.

The first contour lines 48 are non-concentric relative to one another and are positioned asymmetrically relative to the x-y axes, thus indicating that the aluminum film is asymmetrically formed on the wafer. It has been determined that this is due to an effect known as "pumping skew". Typically, conventional sputter deposition systems include a pump (not shown) which is used to evacuate the system.

Further, such systems include a pumping port 72 through which evacuation is performed. For purposes of illustration, the pumping port 72 is shown located in a lower right section of FIG. 3 relative to the map 55. This corresponds to the location of the pumping port 72 relative to the target and wafer in the system. It has been found that evacuation of the system also undesirably alters a desired flow pattern for the process gas. In particular, evacuation by the pump causes the process gas to flow in a direction (indicated by first arrow 52) toward the pumping port 72. This results in a skewing of process gas distribution toward the pumping port 72, ultimately resulting in the formation of a film having undesirable asymmetric non-uniformities.

It has been determined that techniques for correcting symmetrical non-uniformities, such as changing the distance between the sputtering surface 16 and the substrate 12 or adjusting the shape of the magnetic tunnel 34, are not effective in reducing asymmetrical non-uniformities to an acceptable amount. Therefore, it is an object of the present invention to provide a device which reduces asymmetrical film non-uniformities to an acceptable amount. It is a further object to provide a device which may be suitably positioned in relation to the processing chamber so as to reduce such film non-uniformities.

SUMMARY OF THE INVENTION

The present invention relates to a sputtering apparatus for forming a thin film on a substrate. The sputtering apparatus includes a target for providing target material for forming the thin film, wherein the target includes a first area. Further, the sputtering apparatus utilizes a plasma discharge to enable removal of target material from the target. In addition, a main magnet is provided for generating a main magnetic field for controlling the plasma discharge to remove the target material. Further, a compensating magnet is utilized which is positioned adjacent to the first area. The compensating magnet generates a compensating magnetic field which interacts with the main magnetic field to control the plasma discharge in the first area to form a desired erosion pattern in the first area and enable formation of a substantially uniform film thickness on the substrate.

Further, the present invention also relates to a method for controlling removal of material from a first area of a surface. This method includes the step of generating a main magnetic field to control removal of material from the surface. In addition, this method includes the step of generating a compensating magnetic field which interacts with the main magnetic field to control removal of the material in the first area so as to asymmetrically remove the material in the first area to form a desired asymmetric erosion pattern on the surface.

DETAILED DESCRIPTION OF THE INVENTION

Figure 1:
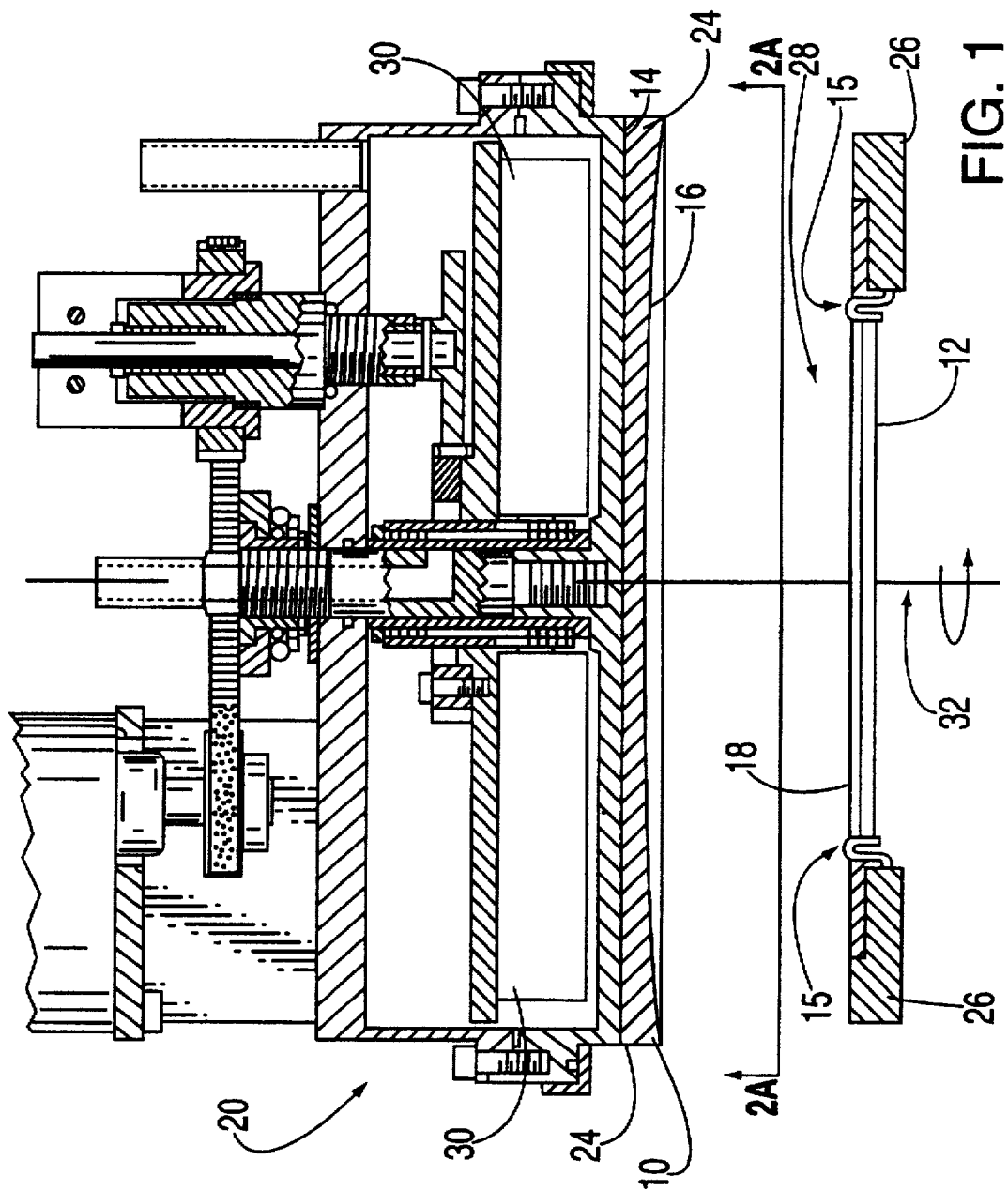
FIG. 1 is a cross sectional view of a conventional target and substrate arrangement.

The present invention will now be described in conjunction with FIGS. 4–7, wherein like elements are designated by like reference numerals.

A substantial portion of the material used in forming the film is obtained from the erosion of target material from the sputtering surface 16 which forms the primary groove 36. Therefore, changes in a radial direction in the location of sections of the primary groove 36, which affect the amount of target material eroded to form the primary groove 36, have a substantial affect on the pattern and uniformity of the film 18 that is formed on the substrate 12.

Figure 4:
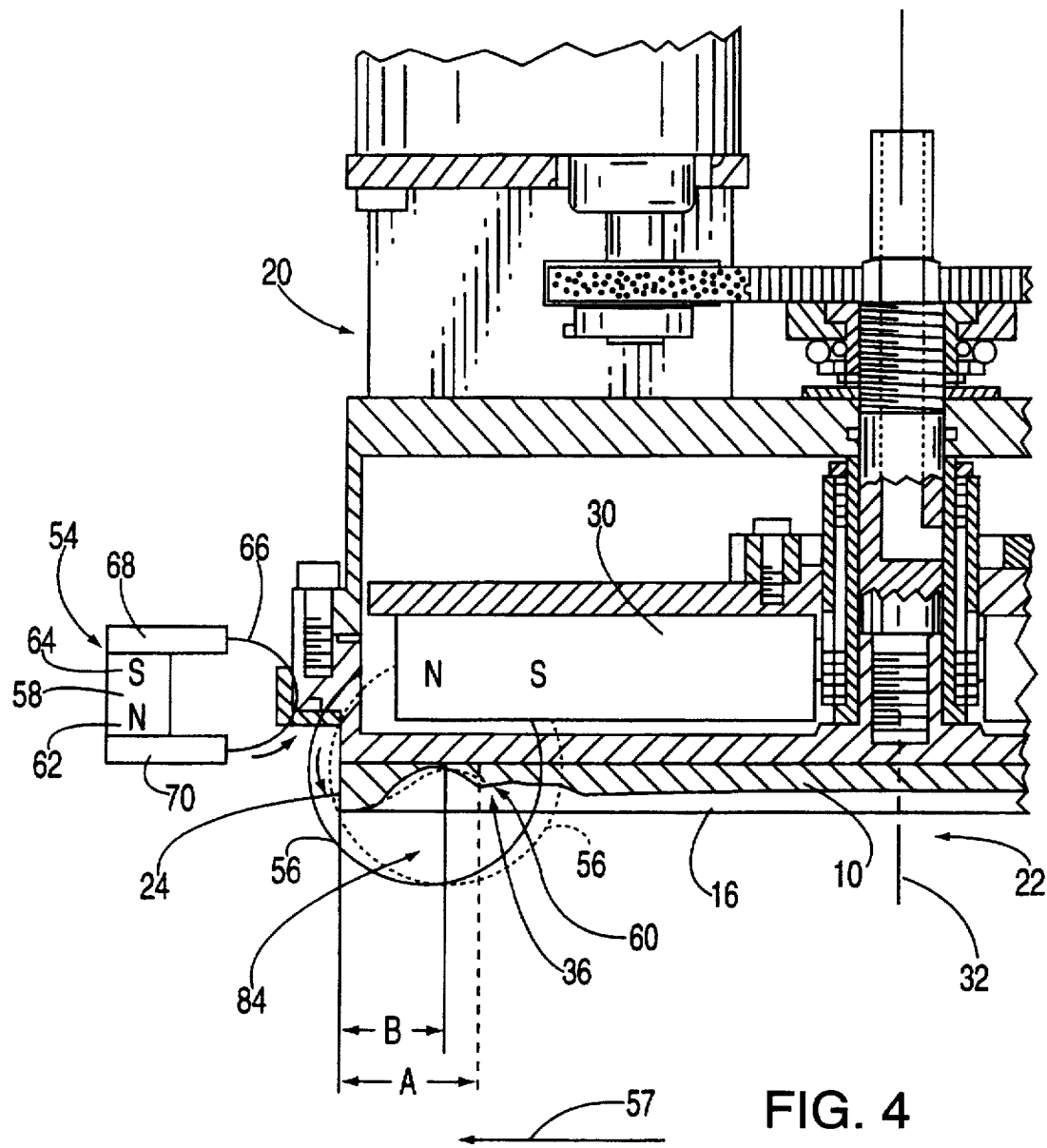
FIG. 4 is an enlarged view of a left portion of FIG. 1 showing a first compensating magnet device in accordance with the present invention.

Referring to FIG. 4, a first compensating magnet device 54 in accordance with the present invention is shown positioned adjacent to the target 10. In the following description of FIGS. 4–6, the primary groove 36 and the main magnetic field 56 are shown in solid lines to indicate a change in location wherein the primary groove 36 is ultimately formed due to the present invention.

The first magnet device 54 is spaced apart from the peripheral wall 24 and is positioned adjacent to a first area 84 on the sputtering surface 16 which includes the primary groove 36. The first magnet device 54 includes a permanent magnet 58 having north 62 and south 64 magnetic poles. In a first embodiment, the permanent magnet 58 is oriented such that the south magnetic pole 64 is vertically positioned above the north magnetic pole 62 to form a first compensating magnetic field 66 oriented in counterclockwise direction. Further, the permanent magnet 58 is positioned between top 68 and bottom 70 field directing pole pieces which serve to control distribution of the first magnetic field 66. Alternatively, the top 68 and bottom 70 field directing pole pieces may be omitted. In addition, an electromagnetic device or soft magnetic shunts may be used.

The first magnetic field 66 interacts with each outer peripheral lobe section 39 of the main magnetic field 56 so as to cause the main magnetic field 56 to shift outward (indicated by second arrow 57) and away from the center area 22 and toward the peripheral wall 24. This causes a corresponding outward shift in the location at which a section of the primary groove 36 is ultimately formed within the first area 84. In particular, primary groove 30 is formed in the first area 84 such that the groove center 60 is positioned a second distance B from the peripheral wall 24 which is less than the first distance A. The outward shift increases the length of the primary groove 36, which thus increases the amount of target material eroded. Further, the outward shift also changes the radial location on the sputtering surface 16 from which the target material is eroded to one that is closer to the peripheral wall 24.

As previously described, a substantial portion of the material used in forming the film 18 is obtained from the erosion of target material from the sputtering surface 16 which forms the primary groove 36. Therefore, an outward shift in the location of the primary groove 36, which causes the erosion of additional target material, substantially affects the pattern and uniformity of the film 18 that is ultimately formed on the substrate 12.

Figure 5:
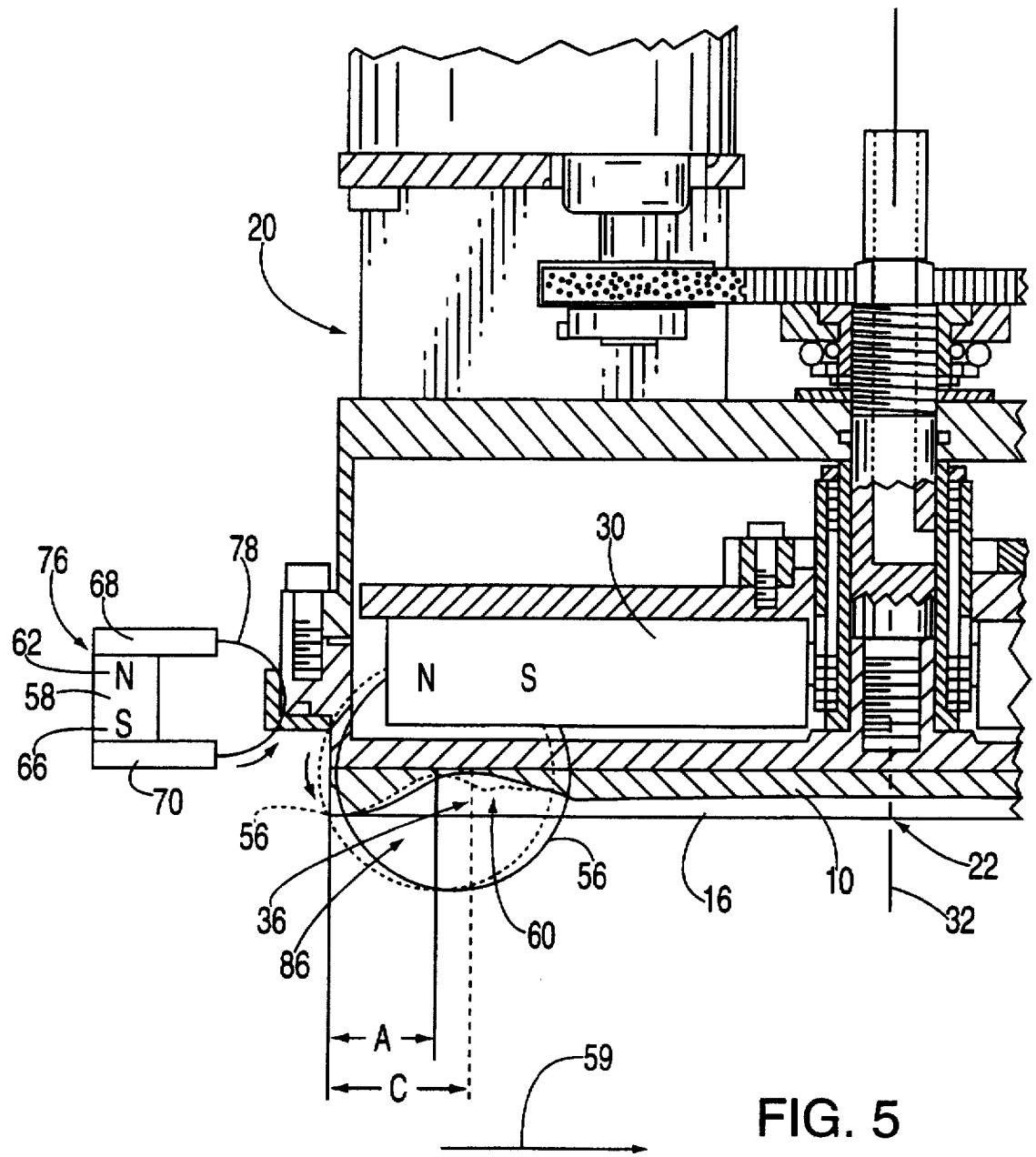
FIG. 5 shows a second embodiment for a second compensating device in accordance with the present invention.

Referring to FIG. 5, a second embodiment for a second compensating magnet device 76 is shown. The second magnet device 76 is positioned adjacent to a second area 86 on the sputtering surface 16 which includes the groove center 60. In the second embodiment, the orientation of the permanent magnet 58 is reversed such that the north magnetic pole 60 is vertically positioned above the south magnetic pole 66 to form a second compensating magnetic field 78 oriented in clockwise direction. The second magnetic field 78 causes the main magnetic field 56 to move in a direction opposite to that described in conjunction with FIG. 4. In particular, the second magnetic field 78 interacts with each outer peripheral lobe section 39 of the main magnetic field 56 so as to cause the main magnetic field 56 to shift inward (indicated by third arrow 59) toward the center area 22 and away from the peripheral wall 24. This causes a corresponding inward shift in the location at which a section of the primary groove 36 is ultimately formed within the second area 86. In particular, the primary groove 36 is formed in the second area 86 such that the groove center 60 is positioned a third distance C from the peripheral wall 24 which is greater than the first distance A. The inward shift decreases the length of the primary groove 36, which thus decreases the amount of target material eroded to form the primary groove 36. Further, the inward shift also changes the radial location on the sputtering surface 16 from which the target material is eroded to one that is further from the peripheral wall 24. This also substantially affects the pattern and uniformity of the film 18 that is ultimately formed on the substrate 12.

It is noted that either the first 54 or second 76 magnet devices may be optimally positioned either inside or outside of the processing chamber in order to provide for suitable interaction between the main 56 and first 66 and/or second 78 magnetic fields.

Figure 6:
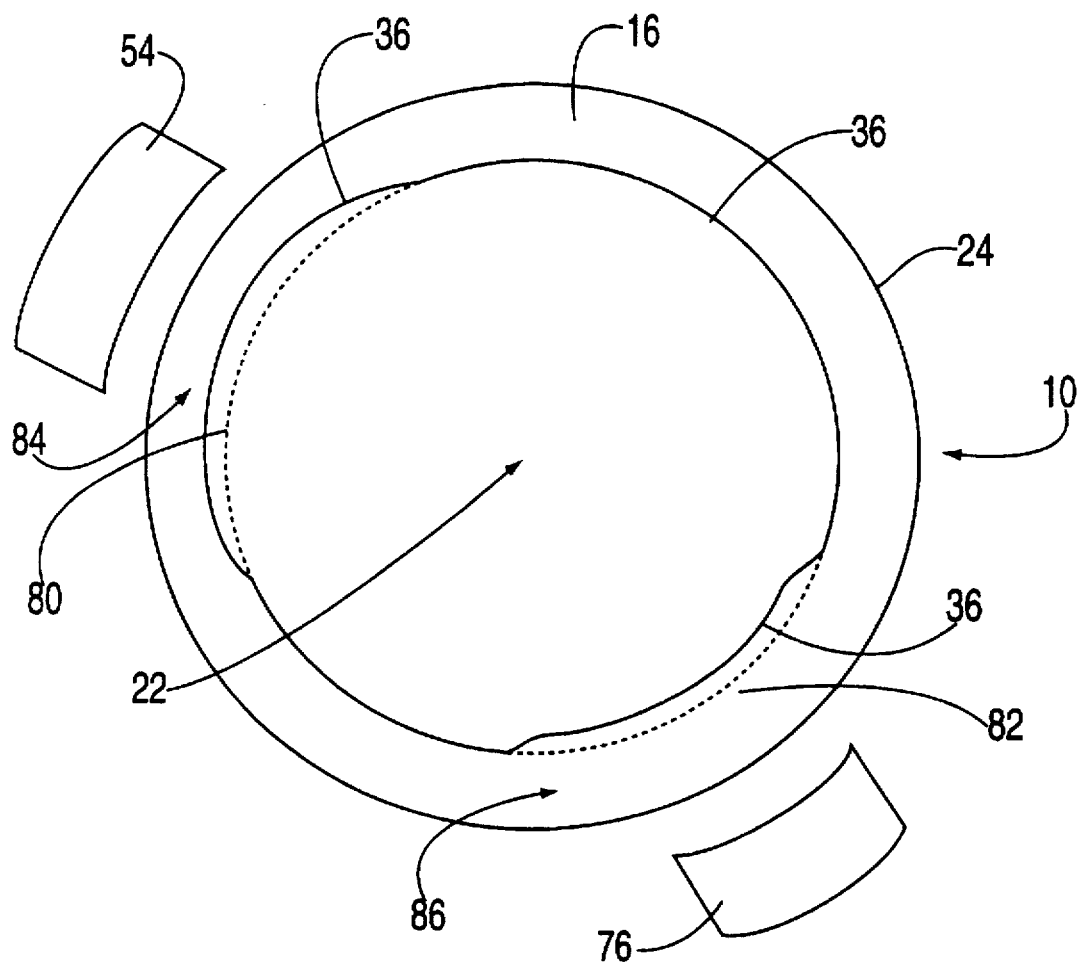
FIG. 6 is a plan view of the first and second compensating devices shown positioned adjacent to a peripheral wall of the target.

Referring to FIG. 6, a plan view of the sputtering surface 16 is shown wherein the first 54 and second 76 magnet devices are shown positioned adjacent to the first 84 and second 86 areas, respectively. In this regard, it is noted that additional magnet devices configured in either the first or second embodiment may be positioned adjacent to other selected areas of the sputtering surface 16 in order to change the location of additional sections of the primary groove 36.

Figure 2A:
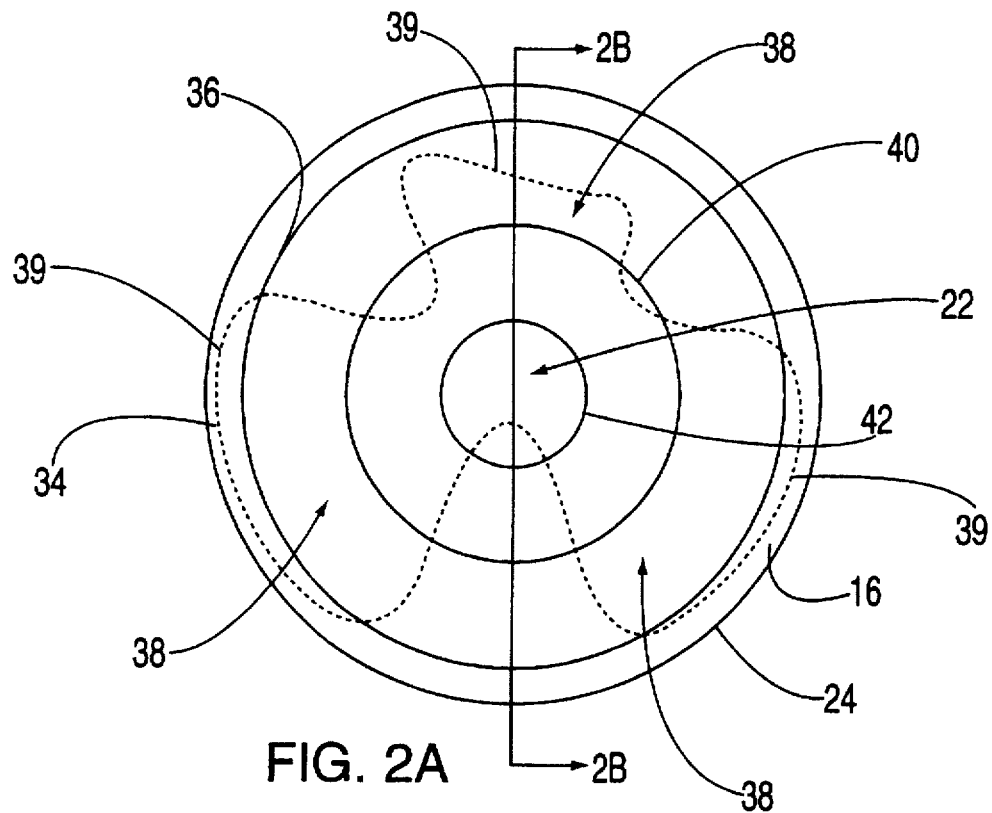
FIG. 2A is a view of a sputtering surface along line 2A—2A of FIG. 1.
Figure 2B:
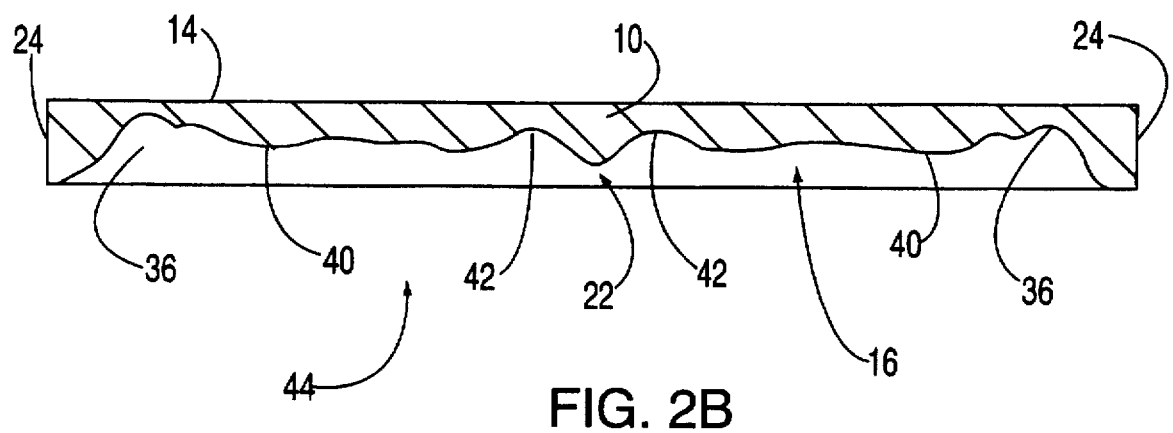
FIG. 2B is a cross sectional view of an erosion profile for the target along line 2B—2B of FIG. 2A.
Figure 2C:
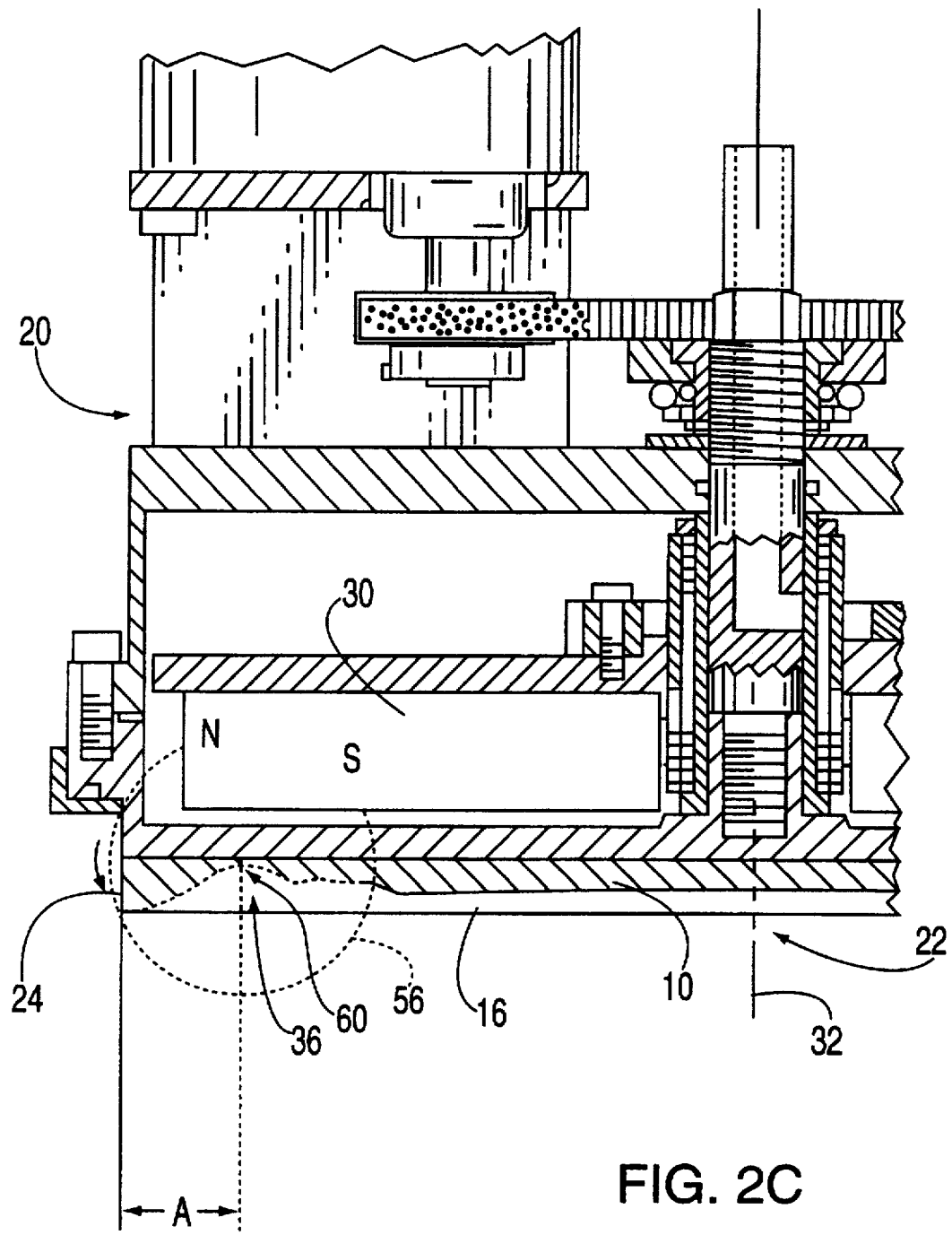
FIG. 2C is an enlarged view of a left portion of FIG. 1 showing a configuration for a primary groove.
Figure 2D:
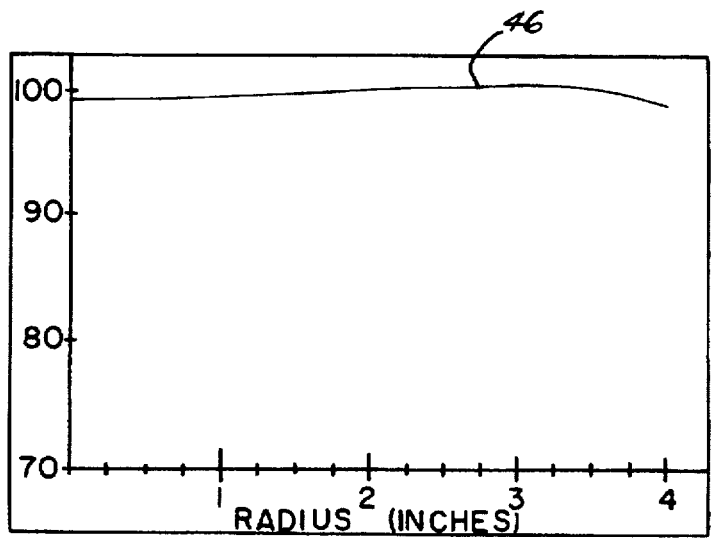
FIG. 2D depicts an erosion profile for a film.

As previously described in conjunction with FIGS. 1–2B, conventional sputter deposition systems typically form a substantially circular primary groove. In accordance with the present invention, the first 54 and second 76 magnet devices each serve to asymmetrically change the location of first 80 and second 82 sections (shown as dashed lines) of the primary groove 36 located in the first 84 and second 86 areas adjacent to the first 54 and second magnet 76 devices, respectively. The first magnetic field 66 (FIG. 4) generated by the first magnetic device 54 causes the main magnetic field 56 to shift outward and away from the center area 22 and toward the peripheral wall 24. This causes a corresponding outward shift in the location at which the first section 80 is formed such that the first section 80 extends outwardly in the first area 84 toward the peripheral wall 24 to thus form an asymmetric erosion pattern.

The second magnetic field 78 (FIG. 5), which is oriented in an opposite direction to that of the first magnetic field 66, causes the second section 82 to extend inwardly toward the center area 22 in a direction opposite to that caused by the first magnetic field 66. In particular, the second magnetic field 78 causes the main magnetic field 56 to shift inward and toward the center area 22 and away from the peripheral wall 24. This causes a corresponding inward shift in the location at which the second section 82 is formed such that the second section 82 extends inwardly in the second area 86 toward the center area 22 to thus form an asymmetric erosion pattern.

Figure 3:
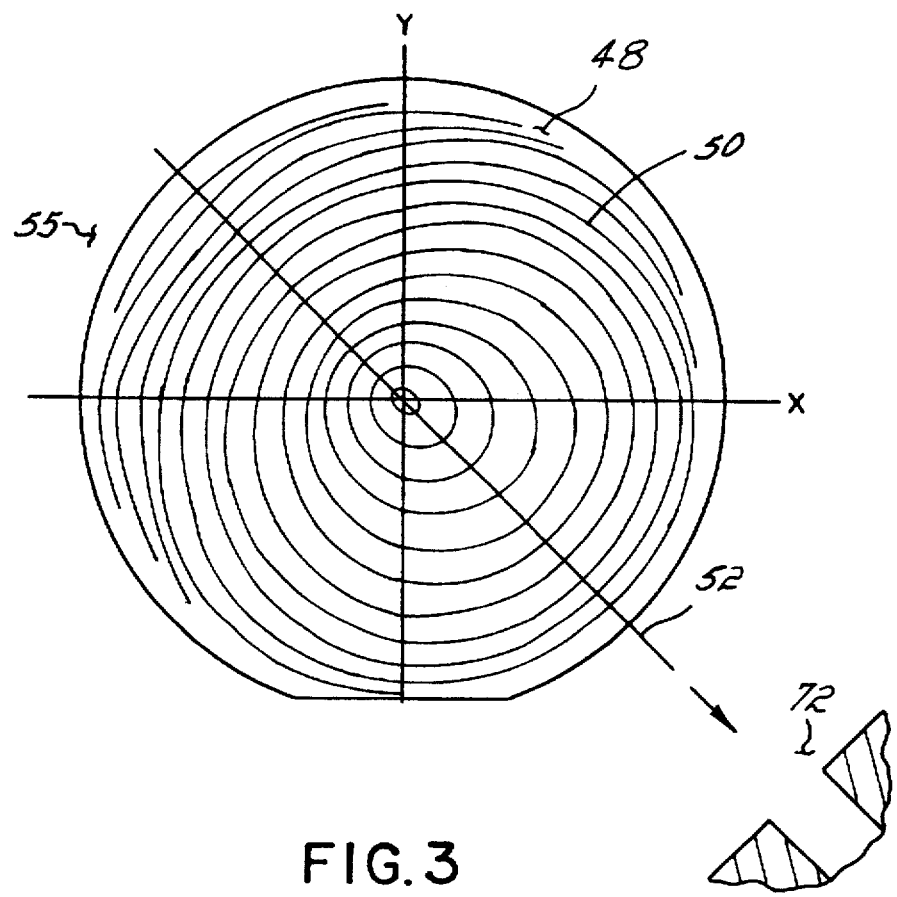
FIG. 3 is a map of the uniformity for an aluminum film formed on a wafer formed by a sputtering process subjected to flow and pressure gradients.
Figure 7:
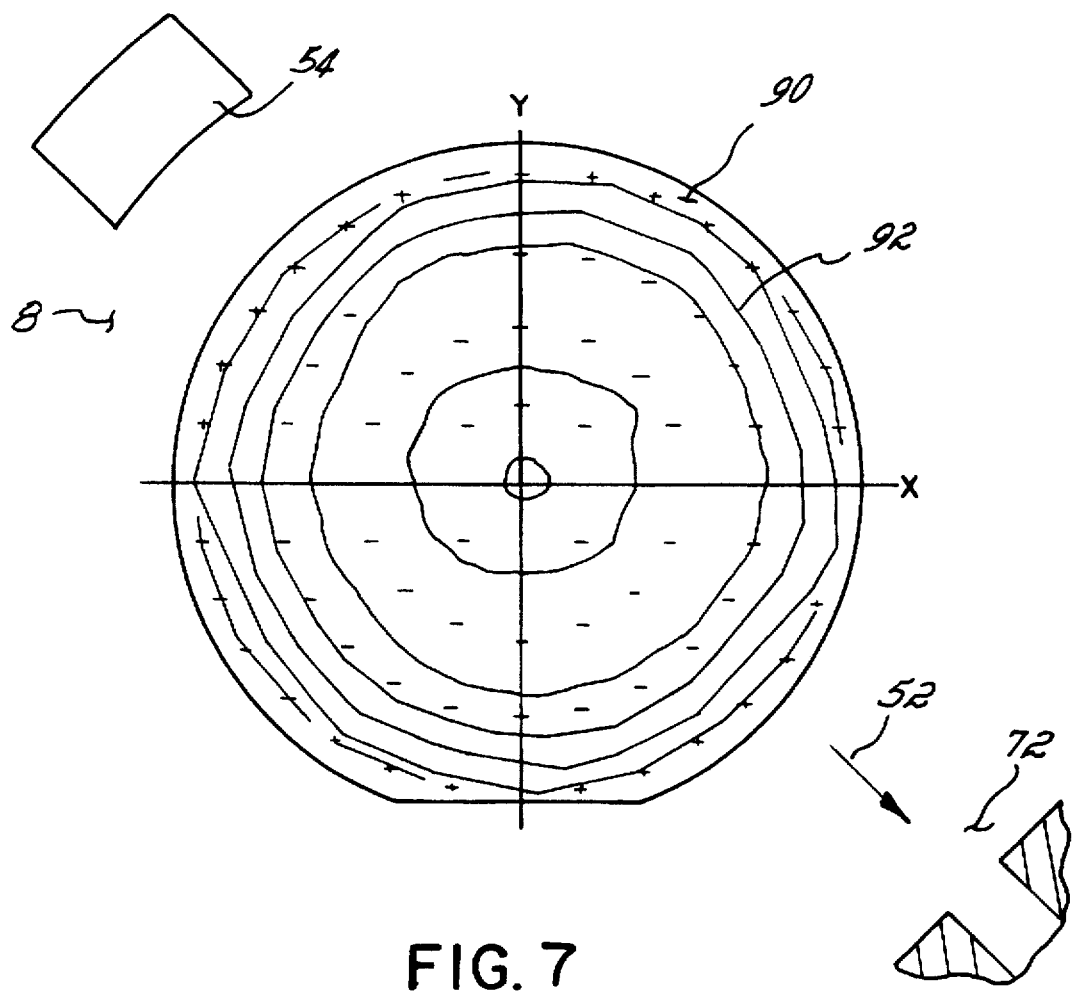
FIG. 7 is a map of the uniformity of an aluminum film formed by using the first magnet device in conjunction with a sputtering process subjected to the flow and pressure gradients.

Referring to FIG. 7, a map 88, relative to x-y axes, is shown of the uniformity of an aluminum film (not shown) formed by using the first magnet device 54 in conjunction with the flow and pressure gradients previously described in conjunction with FIG. 3. In FIG. 7, the first magnetic device 54 is shown in a position relative to the map 88 which corresponds to a position adjacent to the peripheral wall 24 and opposite the pumping port 72. The first magnet device 54 causes a selected section of the primary groove 36 to shift outward (FIG. 4), thus increasing the amount of material eroded from the sputtering surface 16 which is available for forming the film 18. Further, the outward shift also changes the radial location on the sputtering surface 16 from which the target material is eroded to one that is closer to the peripheral wall 24. This forms a new distribution of target material which counteracts the effects on the process gas distribution due to flow and pressure gradients so as to form a substantially symmetric layer.

In FIG. 7, a second plurality of contour lines 90 are shown which include a second mean contour line 92 (shown darker than other contour lines) indicating a second mean thickness. Thickness values for the second contour lines 92 are shown in descending order in TABLE II.

TABLE II (microns)

1.16561
1.15430
1.14290
1.13166 (MEAN)
1.12035
1.10903
1.09771

The second contour lines 92 are substantially concentrically positioned relative one another. In addition, the second contour lines 92 are positioned substantially symmetrically relative to the x-y axes and are not skewed. As such, this indicates that the aluminum film is substantially symmetrically formed on the substrate. Further, non-uniformity is substantially improved to 1.99%.

The present invention has been described in relation to a target and substrate arrangement having an arrangement known as a circular rotating magnet cathode. However, it is noted that the present invention may also be utilized in conjunction with rectangular cathodes having moving internal magnets or cathodes having fixed internal magnets. Additionally, it is noted that the present invention may be utilized in conjunction with a cathode that does not include an internal magnet. In this embodiment, the magnet device directly influences the plasma charge in a localized area of the target to reduce asymmetry non-uniformity. Further, the present invention may be utilized in other processes which utilize a plasma discharge to removal material from the surface of a substrate. This includes a process known as plasma sputter etching, wherein a plasma discharge is used to atomically etch and clean a surface of a substrate. In this process, the magnet device may be used to control the shape and intensity of the plasma discharge to improve uniformity of etching of the substrate.

Thus it is apparent that in accordance with the present invention, an apparatus that fully satisfies the objectives, aims and advantages is set forth above. While the invention has been described in conjunction with specific embodiments, it is evident that many alternatives, modifications, permutations and variations will become apparent to those skilled in the art in light of the foregoing description. Accordingly, it is intended that the present invention embrace all such alternatives, modifications and variations as fall within the scope of the appended claims.

What is claimed is:

1. A sputtering apparatus for forming a thin film on a substrate, comprising:

a target for providing target material for forming said thin film, said target having a peripheral wall and a first area adjacent said peripheral wall;

removal means for removing said target material from said target, said removal means having a plurality of outer portions;

a magnet positioned adjacent to said first area to form an asymmetric magnet arrangement, said magnet generating a magnetic field of sufficient strength for controlling only selected outer portions of said removal means which are located adjacent to said first area to asymmetrically remove said target material in said first area to form a desired asymmetric erosion pattern on said target for compensating for asymmetries in said removal means.

2. The sputtering apparatus according to claim 1, wherein said asymmetric erosion pattern includes a first section and a second section, wherein said first section is formed in a first radial location relative to said peripheral wall and said second section is formed in a second radial location in said first area which is closer to said peripheral wall than said first radial location, and wherein said second section is formed so as to increase an amount of material removed from said target for forming said asymmetric erosion pattern.

3. The sputtering apparatus according to claim 1, wherein said asymmetric erosion pattern includes a first section and a second section, wherein said first section is formed in a first radial location relative to said peripheral wall and said second section is formed in a second radial location in said first area which is further from said peripheral wall than said first radial location, and wherein said second section is formed so as to decrease an amount of material removed from said target for forming said asymmetric erosion pattern.

4. The sputtering apparatus according to claim 1, wherein said magnet is positioned within a processing chamber adjacent said first area.

5. The sputtering apparatus according to claim 1, wherein said target and substrate are positioned within a processing chamber and said magnet is positioned outside of said processing chamber.

6. A sputtering apparatus for forming a thin film on a substrate, comprising:

a target having a peripheral wall and a first area adjacent said peripheral wall, wherein said target is subjected to a plasma environment to remove material from said target for forming said thin film, said plasma environment having a plurality of outer portions;

a main magnet for generating a main magnetic field for controlling said plasma environment to remove said target material;

a compensating magnet positioned adjacent to said first area to form an asymmetric magnet arrangement, said compensating magnet generating a compensating magnetic field which interacts with said main magnetic field and which is of sufficient strength to control only selected outer portions of said removal means which are located adjacent to said first area such that said target is eroded in said first area to form a desired asymmetric erosion pattern on said target for compensating for asymmetries in said plasma environment for forming a substantially uniform film thickness.

7. The sputtering apparatus according to claim 6, wherein said asymmetric erosion pattern includes a first section and a second section, wherein said first section is formed in a first radial location relative to said peripheral wall and said second section is formed in a second radial location in said first area which is closer to said peripheral wall than said first radial location, and wherein said second section is formed so as to increase an amount of material removed from said target for forming said asymmetric erosion pattern.

8. The sputtering apparatus according to claim 6, wherein said asymmetric erosion pattern includes a first section and a second section, wherein said first section is formed in a first radial location relative to said peripheral wall and said second section is formed in a second radial location in said first area which is further from said peripheral wall than said first radial location, and wherein said second section is formed so as to decrease an amount of material removed from said target for forming said asymmetric erosion pattern.

9. The sputtering apparatus according to claim 6, wherein said compensating magnet is positioned within a processing chamber adjacent said first area.

10. The sputtering apparatus according to claim 6, wherein said target and substrate are positioned within a processing chamber and said compensating magnet is positioned outside of said processing chamber.

11. A method for controlling removal of material from a first area of a target surface, comprising the steps of:

providing removal means for removing material from said surface, said removal means having a plurality of outer portions;

generating a main magnetic field to control said removal means for controlling removal of said material from said surface;

generating a compensating magnetic field which interacts with said main magnetic field to form an asymmetric magnet field, said compensating magnetic field being of sufficient strength to control only selected outer portions of said removal means which are located in said first area so as to asymmetrically remove said material in said first area to form a desired asymmetric erosion pattern on said surface for compensating for asymmetries in said removal means.

12. A sputtering apparatus for forming a thin film on a substrate, comprising:

a processing chamber for forming said thin film, wherein said chamber includes said substrate;

a target having a first area, wherein said target is positioned a predetermined distance from said substrate in said chamber and wherein said target is subjected to a plasma environment to remove material from said target for forming said thin film, said plasma environment having a plurality of outer portions;

a main magnet positioned adjacent said target for generating a main magnetic field for controlling said plasma environment to remove said target material from said target including said first area;

a compensating magnet positioned adjacent to said first area to form an asymmetric magnet arrangement, said compensating magnet generating a compensating magnetic field which interacts with said main magnetic field and which is of sufficient strength to control only selected outer portions of said removal means which are located adjacent to said first area such that said target is eroded in said first area to form a desired asymmetric erosion pattern on said target for compensating for asymmetries in said plasma environment for forming a substantially uniform film thickness.

* * * * *